(12) United States Patent
Ronda et al.

(10) Patent No.: US 7,173,313 B2
(45) Date of Patent: Feb. 6, 2007

(54) SEMICONDUCTOR DEVICE WITH INSULATING LAYER HAVING ION-COATED NANOPARTICLES

(75) Inventors: Cornelis Reinder Ronda, Aachen (DE); Stefan Peter Grabowski, Aachen (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/549,015

(22) PCT Filed: Mar. 8, 2004

(86) PCT No.: PCT/IB2004/050208

§ 371 (c)(1),
(2), (4) Date: Sep. 14, 2005

(87) PCT Pub. No.: WO2004/084312

PCT Pub. Date: Sep. 30, 2004

(65) Prior Publication Data

US 2006/0187699 A1 Aug. 24, 2006

(30) Foreign Application Priority Data

Mar. 17, 2003 (EP) .................... 03100662

(51) Int. Cl.
*H01L 29/78* (2006.01)

(52) U.S. Cl. .................. 257/411; 977/943; 977/773; 977/831

(58) Field of Classification Search ........ 977/943, 977/773, 774; 257/66, 71, 410, 411, E29.071

See application file for complete search history.

(56) References Cited

U.S. PATENT DOCUMENTS

| | | | | |
|---|---|---|---|---|
| 4,349,664 | A | * | 9/1982 | Matsumura et al. ........ 528/491 |
| 6,294,401 | B1 | * | 9/2001 | Jacobson et al. ............ 438/99 |
| 7,005,674 | B2 | * | 2/2006 | Lee et al. .................... 257/40 |
| 2001/0048969 | A1 | * | 12/2001 | Constantino et al. ....... 427/215 |
| 2002/0000593 | A1 | | 1/2002 | Koyama et al. |
| 2002/0045045 | A1 | * | 4/2002 | Adams et al. .............. 428/403 |
| 2003/0173586 | A1 | * | 9/2003 | Moriwaki et al. .......... 257/200 |
| 2006/0030135 | A1 | * | 2/2006 | Hu .............................. 438/584 |

FOREIGN PATENT DOCUMENTS

| EP | 0 843 360 | 5/1998 |
|----|-----------|--------|
| EP | 1 226 878 | 7/2002 |

* cited by examiner

Primary Examiner—Richard T. Elms
Assistant Examiner—Michael Lulis
(74) Attorney, Agent, or Firm—Peter Zawilski

(57) ABSTRACT

A semiconductor device, which is arranged in a semiconductor body (1), and which comprises at least one source region (4) and at least one drain region (5), each being of the first conductivity type, and at least one body (8) of the second conductivity type, arranged between source region (4) and drain region (5), and at least one gate electrode (10) which is isolated with respect to the semiconductor body (1) via an isolation layer (9). Said isolation layer (9) comprises polarizable particles, which are composed of a nanoparticulate isolating core and a sheath of polarizable anions or polarizable cations. The isolation layer (9) exhibits a high dielectric constant ε.

3 Claims, 1 Drawing Sheet

SEMICONDUCTOR DEVICE WITH INSULATING LAYER HAVING ION-COATED NANOPARTICLES

Figure 1:
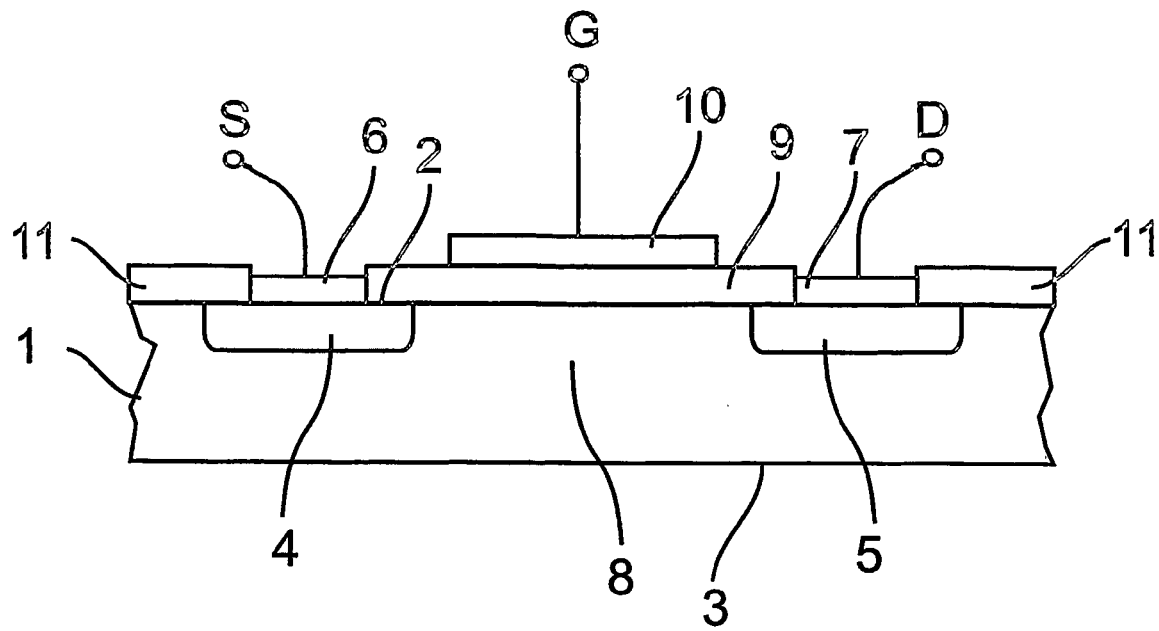

The invention relates to a semiconductor device, which is arranged in a semiconductor body, and which comprises at least one source region and at least one drain region, each being of the first conductivity type, and at least one body region of the second conductivity type, arranged between source region and drain region, and at least one gate electrode which is isolated with respect to the semiconductor body via an isolation layer.

Devices with a transistor function are known in many embodiments. One of these embodiments is a type of transistor designated as field effect transistor (FET). In the case of a field effect transistor, the charge carrier density in an electric channel, which is in contact with the source region and the drain region, is changed by applying a voltage to a control electrode (gate electrode). The control electrode may be separated from the channel by a blocking pn-junction (J-FET) or by an isolating layer (generally $SiO_2$ or a metal oxide) (MOSFET). In the case of a MOSFET, a conductive channel is generated by induction under the gate electrode at an increasing negative gate voltage.

The development of electronic devices is characterized notably by the trend towards miniaturization. As regards the miniaturization of field effect transistors, also the layer thickness of the isolating layer (gate oxide) is scaled down in a proportional manner. If the layer thicknesses are too small, however, the leakage current increases drastically, so that the function of the device is adversely affected. It is not possible however to use a thicker isolation layer since the polarizability of the nowadays customarily used materials in the isolation layer is not high enough.

Therefore it is an object of the invention to provide an improved semiconductor device with an isolation layer comprising materials having a high polarizability.

This object is achieved by a semiconductor device, which is arranged in a semiconductor body, and which comprises at least one source region and at least one drain region, each being of the first conductivity type, and at least one body region of the second conductivity type, arranged between source region and drain region, and at least one gate electrode which is isolated with respect to the semiconductor body via an isolation layer, said isolation layer comprising polarizable particles, which each have a nanoparticulate core whose surface is modified with polarizable ions.

The modification of the surface of the nanoparticles with polarizable ions leads overall to a high polarizability of said nanoparticles. An isolator layer of such polarizable particles exhibits an increased dielectric constant. By virtue of said increased dielectric constant of the isolator layer, semiconductor devices, in particular field effect transistors, can be manufactured, wherein overall the layer thickness of the isolator layer, in the case of miniaturization of the semiconductor device, cannot be reduced at all or can be reduced to a smaller extent as compared to the overall miniaturization of the semiconductor device, without a reduction of the charge density induced at the interface with the body region. These semiconductor devices can be operated at low gate voltages.

Advantageously selected ions as disclosed include large, mostly multi-charged anions with a readily deformable diffuse electron sheath.

The advantageously selected ions as claimed in claim 1 are cations with a readily deformable diffuse electron sheath.

The advantageously selected materials as claimed in claims 2 and 3 are isolating materials which partly have a high dielectric constant $\epsilon > 20$.

These and other aspects of the invention are apparent from and will be elucidated with reference to the embodiment(s) described hereinafter.

Figure 2:
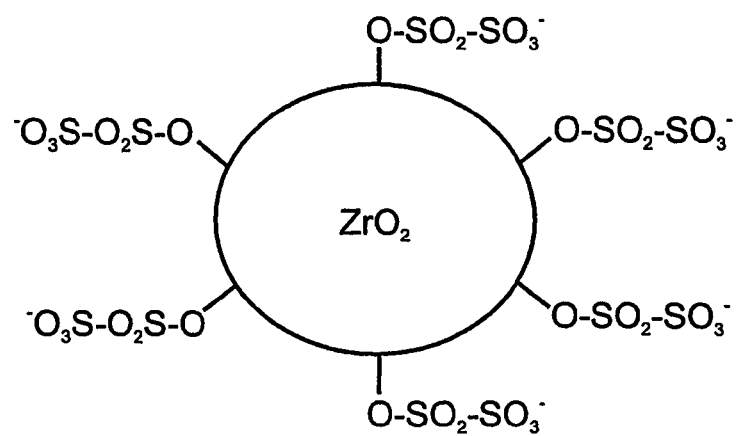

In the drawings:

FIG. 1 is a cross-sectional view of the structure of a MOS field effect transistor, and FIG. 2 diagrammatically shows a polarizable particle in accordance with the invention comprising a nanoparticulate core and polarizable anions at the surface of the nanoparticulate core.

FIG. 1 diagrammatically shows the structure of a MOSFET. A semiconductor body 1, for example of silicon, GaAs, SiC, GaN or InP, comprises a first surface 2 (front side of the slice) and a second surface 3 (rear side of the slice). In the first surface 2 there is arranged a heavily n-doped source region 4 and, spaced therefrom, a heavily n-doped drain region 5. In this embodiment of a MOSFET, the first conductivity type thus is the n-type, the second conductivity type is the p-type, and an n-channel MOSFET is obtained. In principle, the n and p-dopings may be reversed, so that a p-channel MOSFET is obtained. As the doping atom for the p-conductive regions use can be made, for example, of boron, and as the doping atoms for n-conductive regions use can be made, for example, of phosphor, arsenic or antimony. The source region 4 is electroconductively contacted via a source metallization 6 (source electrode), the drain region 5 is electroconductively contacted via a drain metallization 7 (drain electrode). Between source region 4 and drain region 5 a p-conductive body region 8 is arranged. At the area where parts of the body region 8 reach the first surface 2, a gate electrode 10 (control electrode) is arranged which is isolated from the semiconductor body 1 by an isolation layer 9. The gate electrode 10, the source electrode 6 and the drain electrode 7 are connected with, respectively, the gate connection G, source connection S and drain connection D, are spaced apart at the first surface 2, and are externally isolated by means of a passivation layer, for example a field oxide, (not shown in FIG. 1). The gate electrode 10, the source electrode 6 and the drain electrode 7 may comprise, for example, the following materials: Al, Au—Sb, Ni—Ge, Au—Ni—Ge, Ni—Ag—Ge, Ni—Pd—Ge, Ni—Pt—Ge, Ni—In—Ge, Ti, Al—Ti, Al—Ti—Al, Ni, Ti—Au or Pd—Au. In individual cases, the choice of the material depends, inter alia, on the semiconductor material used and on the doping type.

If no voltage or a negative voltage is applied to the gate electrode 10, then the arrangement blocks the current flow from the source region 4 into the drain region 5 for both polarities since one of the two pn-junctions is continuously reverse-biased. If a positive voltage is applied to the gate electrode 10, then induction causes negative charge carriers to accumulate in the body region 8 at the interface with the isolation layer 9, and a thin n-conductive channel is formed. This layer is also referred to as inversion layer because the conductivity type changes from p to n. As a result, a current flow between the source region 4 and the drain region 5 becomes possible.

The isolation layer contains polarizable particles which each comprise a nanoparticulate core, the surface of which is modified with polarizable ions. Said nanoparticulate core preferably comprises an isolating metal oxide. Said nanoparticulate core comprises, for example, a material selected from the group consisting of $HfO_2$, $ZrO_2$, $Ta_2O_5$ and BaTiO$_3$. It is particularly preferred that the nanoparticulate core comprises ZrO$_2$ or HfO$_2$ as these materials have a high dielectric constant ε.

The particle diameter of the nanoparticulate cores is preferably <250 nm. It is particularly preferred for the particle diameter to be <100 nm. An isolation layer 9 may comprise nanoparticulate cores having an approximately equal particle diameter. Alternatively, the isolation layer 9 may comprise nanoparticulate cores having very different particle diameters. In the latter case, a high packing density can be achieved in the isolation layer 9, which brings about the good isolating property of the isolation layer 9.

The polarizable ions may be anions or cations.

Polarizable anions are large, mostly multi-charged anions having a readily deformable, diffuse electron sheath. Particularly anions having a high charge density are suitable. The polarizable anions are preferably selected from the group consisting of NO$_3^-$, SO$_4^{2-}$, ClO$_4^-$, I$^-$, SCN$^-$, S$_2$O$_3^{2-}$, BrO$_3^-$, ClO$_3^-$, P$_2$O$_7^{2-}$, Si$_2$O$_7^{2-}$, SiO$_4^-$ and BO$_3^-$. It is particularly preferred that the polarizable anions are highly charged oxide clusters such as, for example, P$_2$O$_7^{2-}$, Si$_2$O$_7^{2-}$, SiO$_4^-$ and BO$_3^-$.

Polarizable cations are, for example, (C$_6$H$_5$)$_3$C$^+$ or (CH$_3$)$_3$C$^+$. In particular cations with aromatic substituents are suitable. The cations coordinate the nanoparticles via ions at the surface.

FIG. 2 diagrammatically shows a polarizable particle comprised of a nanoparticulate core of ZrO$_2$ with polarizable thiosulphate anions at the surface of the nanoparticulate core.

An isolation layer 9 with polarizable particles comprising a nanoparticulate core and anions at the surface may additionally comprise small, hard cations such as Li$^+$, Na$^+$, K$^+$ or H$_3$O$^+$. These small cations bring about a very strong deformation of the diffuse electron sheaths of the anions.

To manufacture the polarizable particles, first the nanoparticulate, metal oxide-containing cores are manufactured. Said nanoparticulate cores can be manufactured using synthesis methods which are employed for the manufacture of nanoparticulate composite semiconductors, so-termed quantum dots. The nanoparticulate, metal oxide-containing cores can thus be manufactured at high temperatures, for example, by pyrolysis of organometallic precursors in coordinating solvents such as hexadecyl amine (HAD), trioctyl phosphine oxide (TOPO) or trioctyl phosphine (TOP). The particle diameter of the nanoparticulate cores can be controlled by means of the coordinating solvents.

The nanoparticulate cores may alternatively be manufactured by means of other methods, such as for example sol-gel methods or micro-emulsion methods. The choice of the suitable synthesis method is governed by the material of the nanoparticulate core.

Subsequently, the stabilizing ligands are substituted with, for example, the polarizable anions. To this end, the nanoparticulate cores are introduced into a solvent in which they do not dissolve. The precipitated nanoparticulate cores are then introduced into a solvent, for example water, alcohol or a water-alcohol mixture, in which they dissolve, said solvent also comprising, however, the polarizable anions in a high concentration. Due to the high affinity between the nanoparticulate cores and the polarizable anions, the stabilizing ligands are substituted with the polarizable anions. A suspension comprising the polarizable particles is obtained.

Alternatively, the polarizable particles may also be directly manufactured by synthesis of the nanoparticulate, metal oxide-containing cores in the presence of polarizable anions. By the addition of an appropriate metal, such as for example Ba$^{2+}$ and/or by setting the pH-value, the polarizable particles can be precipitated from the solution.

To manufacture polarizable particles with cations at the surface, suitable precursors such as (C$_6$H$_5$)$_3$CCl or (CH$_3$)$_3$CCl are converted to the corresponding cations by using an acid, for example a Lewis acid such as BF$_3$, which cations then coordinate at the surface of the nanoparticles. In the case of metal oxide-containing cores, this takes place, for example, via oxygen atoms which are present at the surface.

To manufacture the isolation layer 9, the suspension with the polarizable particles is applied to the appropriate areas of the body region 8 by means of centrifuging or electrophoretic deposition. Subsequently, the small, hard cations may be introduced into the isolation layer 9 by adding a diluted acid or salt solution containing for example MNO$_3$, M$_2$CO$_3$ or MHCO$_3$, where M=Li$^+$, Na$^+$, or K$^+$. After drying, a compact isolation layer 9 is obtained.

To manufacture a semiconductor device in accordance with the invention, first the n-conductive source region 4 and the n-conductive drain region 5 are produced by ion implantation of phosphorus into the semiconductor body 1 of boron-doped silicon. Subsequently, by means of a lithographic process, the source electrode 6 and the drain electrode 7 of Al doped with 0.5% by weight Cu are provided. The isolation layer 9 is provided between the two electrodes 4, 5 by means of electrophoretic deposition and dried. The isolation layer 9 comprises polarizable particles having a ZrO$_2$-containing nanoparticulate core with a particle diameter of approximately 100 nm and, at the surface, BO$_3^-$ anions. Next the gate electrode 10 of Al is provided on the isolation layer 9.

As compared to customary semiconductor devices, the isolation layer 9 may be embodied so as to have a larger layer thickness, so that the semiconductor device in accordance with the invention exhibits a lower leakage current. If use is made of layer thicknesses that are equal to those used in customary semiconductor devices, the semiconductor device in accordance with the invention can be operated at lower gate voltages.

The invention claims is:

1. A semiconductor device, arranged in a semiconductor body, and the semiconductor device comprises at least one source region and at least one drain region, each being of the first conductivity type, and at least one body region of the second conductivity type, arranged between source region and drain region, and at least one gate electrode which is isolated with respect to the semiconductor body via an isolation layer, said isolation layer comprising polarizable particles, which each have a nanoparticulate core whose surface is modified with polarizable ions, characterized in that the polarizable ions are selected from the group consisting of (C$_6$H$_5$)$_3$C$^+$ (CH$_3$)$_3$C$^+$.

2. A semiconductor device as claimed in claim 1, characterized in that the nanoparticulate core comprises a metal oxide.

3. A semiconductor device as claimed in claim 2, characterized in that the nanoparticulate core comprises a material selected from the group consisting of HfO$_2$, ZrO$_2$, Ta$_2$O$_5$ and BaTiO$_3$.

* * * * *